(12) United States Patent
Lee et al.

(10) Patent No.: US 7,845,891 B2
(45) Date of Patent: Dec. 7, 2010

(54) DECOUPLED CHAMBER BODY

(75) Inventors: Jae-Chull Lee, San Jose, CA (US);
Shinichi Kurita, San Jose, CA (US);
John M. White, Hayward, CA (US);
Suhail Anwar, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1093 days.

(21) Appl. No.: 11/332,781

(22) Filed: Jan. 13, 2006

(65) Prior Publication Data
US 2007/0166133 A1    Jul. 19, 2007

(51) Int. Cl.
*H01L 21/677* (2006.01)
(52) U.S. Cl. .............. 414/217; 414/939; 220/4.26; 220/4.27
(58) Field of Classification Search .......... 220/4.26, 220/4.27; 414/217, 939; 277/913
See application file for complete search history.

(56) References Cited

U.S. PATENT DOCUMENTS

| 3,248,119 | A | * | 4/1966 | Smith et al. ............... 277/637 |
| 3,976,330 | A | | 8/1976 | Babinski et al. |
| 4,047,624 | A | | 9/1977 | Dorenbos |
| 4,178,113 | A | | 12/1979 | Beaver, II et al. |
| 4,311,542 | A | | 1/1982 | Mueller et al. |
| 4,512,391 | A | | 4/1985 | Harra |
| 4,655,584 | A | | 4/1987 | Tanaka et al. |
| 4,680,061 | A | | 7/1987 | Lamont, Jr. |
| 4,687,542 | A | | 8/1987 | Davis et al. |
| 4,693,777 | A | | 9/1987 | Hazano et al. |
| 4,709,655 | A | | 12/1987 | Van Mastrigt |
| 4,759,681 | A | | 7/1988 | Nogami |
| 4,770,590 | A | | 9/1988 | Hugues et al. |
| 4,775,281 | A | | 10/1988 | Prentakis |
| 4,784,377 | A | | 11/1988 | Woodward |
| 4,785,962 | A | | 11/1988 | Toshima |
| 4,801,241 | A | | 1/1989 | Zajac et al. |
| 4,816,098 | A | | 3/1989 | Davis et al. |
| 4,828,224 | A | | 5/1989 | Crabb et al. |
| 4,836,733 | A | | 6/1989 | Hertel et al. |
| 4,846,102 | A | | 7/1989 | Ozias |
| 4,857,689 | A | | 8/1989 | Lee |
| 4,863,547 | A | | 9/1989 | Shidahara et al. |
| 4,870,923 | A | | 10/1989 | Sugimoto |

(Continued)

FOREIGN PATENT DOCUMENTS

EP    0359525    3/1990

(Continued)

OTHER PUBLICATIONS

Office Action dated Nov. 16, 2007 for Korean Patent Application No. 10-2007-0003886.

(Continued)

*Primary Examiner*—Anthony Stashick
*Assistant Examiner*—Christopher B McKinley
(74) *Attorney, Agent, or Firm*—Patterson & Sheridan, LLP

(57) ABSTRACT

Embodiments of the invention include a chamber body having at least one of a top or bottom decoupled from the sidewalls of the chamber body. The invention is suitable for use as a load lock chamber, substrate transfer chamber and vacuum processing chambers, among others.

21 Claims, 8 Drawing Sheets

U.S. PATENT DOCUMENTS

| | | |
|---|---|---|
| 4,880,349 A | 11/1989 | Woodward |
| 4,889,319 A * | 12/1989 | Phillips et al. ............... 251/368 |
| 4,895,107 A | 1/1990 | Yano et al. |
| 4,911,103 A | 3/1990 | Davis et al. |
| 4,913,929 A | 4/1990 | Moslehi et al. |
| 4,923,584 A | 5/1990 | Bramhall, Jr. et al. |
| 4,951,601 A | 8/1990 | Mayden et al. |
| 4,952,299 A | 8/1990 | Chrisos et al. |
| 4,966,519 A | 10/1990 | Davis et al. |
| 4,989,543 A | 2/1991 | Schmitt |
| 4,990,047 A | 2/1991 | Wagner et al. |
| 5,001,327 A | 3/1991 | Hirasawa et al. |
| 5,020,475 A | 6/1991 | Crabb et al. |
| 5,044,871 A | 9/1991 | Davis et al. |
| 5,060,354 A | 10/1991 | Chizinsky |
| 5,131,460 A | 7/1992 | Krueger |
| 5,186,718 A | 2/1993 | Tepman et al. |
| 5,187,115 A | 2/1993 | Coleman |
| 5,199,483 A | 4/1993 | Bahng |
| 5,202,716 A | 4/1993 | Tateyama et al. |
| 5,224,809 A | 7/1993 | Maydan et al. |
| 5,227,708 A | 7/1993 | Lowrance |
| 5,247,424 A * | 9/1993 | Harris et al. ................. 361/704 |
| 5,252,807 A | 10/1993 | Chizinsky |
| 5,254,170 A | 10/1993 | Devibiss et al. |
| 5,259,881 A | 11/1993 | Edwards et al. |
| 5,259,883 A | 11/1993 | Yamabe et al. |
| 5,261,935 A | 11/1993 | Ishii et al. |
| 5,288,379 A | 2/1994 | Namiki et al. |
| 5,292,393 A | 3/1994 | Maydan et al. |
| 5,352,294 A | 10/1994 | White et al. |
| 5,355,066 A | 10/1994 | Lowrance |
| 5,374,147 A | 12/1994 | Hiroki et al. |
| 5,376,212 A | 12/1994 | Saiki |
| 5,404,894 A | 4/1995 | Shiraiwa |
| 5,421,889 A | 6/1995 | Pollock et al. |
| 5,443,346 A | 8/1995 | Murata et al. |
| 5,445,484 A | 8/1995 | Kato et al. |
| 5,447,409 A | 9/1995 | Grunes et al. |
| 5,464,313 A | 11/1995 | Ohsawa |
| 5,469,035 A | 11/1995 | Lowrance |
| 5,470,784 A | 11/1995 | Coleman |
| 5,474,410 A | 12/1995 | Ozawa et al. |
| 5,512,320 A | 4/1996 | Turner et al. |
| 5,516,732 A | 5/1996 | Flegal |
| 5,535,908 A * | 7/1996 | Sheu ......................... 220/4.27 |
| 5,536,128 A | 7/1996 | Shimoyashiro et al. |
| 5,558,482 A | 9/1996 | Hiroki et al. |
| 5,562,383 A | 10/1996 | Iwai et al. |
| 5,570,994 A | 11/1996 | Somekh et al. |
| 5,586,585 A | 12/1996 | Bonora et al. |
| 5,588,827 A | 12/1996 | Muka |
| 5,607,009 A | 3/1997 | Turner et al. |
| 5,609,689 A | 3/1997 | Kato et al. |
| 5,611,655 A | 3/1997 | Fukasawa et al. |
| 5,611,865 A | 3/1997 | White et al. |
| 5,615,988 A | 4/1997 | Wiesler et al. |
| 5,616,208 A | 4/1997 | Lee |
| 5,636,964 A | 6/1997 | Somekh et al. |
| 5,655,277 A | 8/1997 | Galdos et al. |
| 5,674,786 A | 10/1997 | Turner et al. |
| 5,685,684 A | 11/1997 | Kato et al. |
| 5,695,568 A | 12/1997 | Sinha et al. |
| 5,697,749 A | 12/1997 | Iwabuchi et al. |
| 5,700,127 A | 12/1997 | Harada et al. |
| 5,716,207 A | 2/1998 | Mishina et al. |
| 5,738,767 A | 4/1998 | Coad et al. |
| 5,751,003 A | 5/1998 | Rose et al. |
| 5,784,799 A | 7/1998 | Kato et al. |
| 5,793,050 A | 8/1998 | Rose et al. |
| 5,795,355 A | 8/1998 | Moran |
| 5,820,679 A | 10/1998 | Yokoyama et al. |
| 5,833,426 A | 11/1998 | Marohl |
| 5,855,681 A | 1/1999 | Maydan et al. |
| 5,855,726 A | 1/1999 | Soraoka et al. |
| 5,882,165 A | 3/1999 | Maydan et al. |
| 5,884,009 A | 3/1999 | Okase |
| 5,891,251 A | 4/1999 | MacLeish et al. |
| 5,902,088 A | 5/1999 | Faribairn et al. |
| 5,909,994 A | 6/1999 | Blum et al. |
| 5,913,978 A | 6/1999 | Kato et al. |
| 5,934,856 A | 8/1999 | Asakawa et al. |
| 5,942,013 A | 8/1999 | Akimoto |
| 5,944,857 A | 8/1999 | Edwards et al. |
| 5,951,770 A | 9/1999 | Perlov et al. |
| 5,954,472 A | 9/1999 | Hofmeister et al. |
| 5,961,269 A | 10/1999 | Kroeker |
| 5,989,346 A | 11/1999 | Hiroki |
| 5,997,235 A | 12/1999 | Hofmeister |
| 6,007,675 A | 12/1999 | Toshima |
| 6,012,192 A | 1/2000 | Sawada et al. |
| 6,016,611 A | 1/2000 | White et al. |
| 6,034,000 A | 3/2000 | Heyder et al. |
| 6,039,770 A | 3/2000 | Yang et al. |
| 6,042,623 A | 3/2000 | Edwards |
| 6,044,534 A | 4/2000 | Seo et al. |
| 6,048,154 A | 4/2000 | Wytman |
| 6,059,507 A | 5/2000 | Adams |
| 6,079,693 A | 6/2000 | Ettinger et al. |
| 6,082,950 A | 7/2000 | Altwood et al. |
| 6,086,362 A | 7/2000 | White et al. |
| 6,106,634 A | 8/2000 | Ghanayem et al. |
| 6,143,083 A | 11/2000 | Yonemitsu et al. |
| 6,145,673 A | 11/2000 | Burrows et al. |
| 6,176,667 B1 | 1/2001 | Fairbairn et al. |
| 6,176,668 B1 | 1/2001 | Kurita et al. |
| 6,186,722 B1 * | 2/2001 | Shirai ......................... 414/217 |
| 6,193,507 B1 | 2/2001 | White et al. |
| 6,206,176 B1 | 3/2001 | Blonigan |
| 6,213,704 B1 | 4/2001 | White et al. |
| 6,215,897 B1 | 4/2001 | Beer et al. |
| 6,224,680 B1 | 5/2001 | Toshima |
| 6,234,107 B1 * | 5/2001 | Tanaka et al. ........... 118/723 R |
| 6,235,634 B1 | 5/2001 | White et al. |
| 6,254,328 B1 | 7/2001 | Wytman |
| 6,270,582 B1 | 8/2001 | Rivkin et al. |
| 6,286,230 B1 | 9/2001 | White et al. |
| 6,315,512 B1 | 11/2001 | Tabrizi et al. |
| 6,318,945 B1 | 11/2001 | Hofmeister |
| 6,338,626 B1 | 1/2002 | Saeki |
| 6,340,405 B2 | 1/2002 | Park |
| 6,382,895 B1 | 5/2002 | Konishi et al. |
| 6,405,423 B1 * | 6/2002 | Donde ......................... 29/428 |
| 6,410,455 B1 | 6/2002 | Kuribayashi et al. |
| 6,431,807 B1 | 8/2002 | Stevens et al. |
| 6,435,868 B2 | 8/2002 | White et al. |
| 6,450,750 B1 | 9/2002 | Heyder et al. |
| 6,486,444 B1 | 11/2002 | Fairbairn et al. |
| 6,503,365 B1 | 1/2003 | Kim et al. |
| 6,517,303 B1 | 2/2003 | White et al. |
| 6,551,045 B2 * | 4/2003 | Binnard et al. ............... 414/217 |
| 6,558,509 B2 | 5/2003 | Kraus et al. |
| 6,568,552 B1 | 5/2003 | Tabrizi et al. |
| 6,568,899 B1 | 5/2003 | Kuribayashi et al. |
| 6,602,797 B2 | 8/2003 | Kuribayashi et al. |
| 6,609,869 B2 | 8/2003 | Aggarwal et al. |
| 6,610,150 B1 | 8/2003 | Savage et al. |
| 6,647,665 B1 | 11/2003 | Tabrizi et al. |
| 6,881,305 B2 * | 4/2005 | Black et al. ............... 204/192.1 |
| 6,902,624 B2 | 6/2005 | Seidel et al. |
| 6,949,143 B1 | 9/2005 | Kurita et al. |
| 7,104,535 B2 | 9/2006 | Kurita et al. |
| 7,207,766 B2 | 4/2007 | Kurita et al. |
| 7,375,041 B2 * | 5/2008 | Jang ......................... 438/800 |

| | | | | | | |
|---|---|---|---|---|---|---|
| 2002/0034886 A1 | 3/2002 | Kurita et al. | | JP | 7-86169 | 3/1995 |
| 2002/0061243 A1* | 5/2002 | Binnard et al. ............... 414/217 | | JP | 8-264452 | 10/1996 |
| 2002/0108571 A1* | 8/2002 | Black et al. ................. 118/715 | | JP | 09027536 | 1/1997 |
| 2002/0137346 A1 | 9/2002 | Donaldson et al. | | JP | 09-223727 | 8/1997 |
| 2002/0159864 A1 | 10/2002 | Lowrance | | JP | 10-107126 | 4/1998 |
| 2002/0178562 A1* | 12/2002 | Aoki et al. .................... 29/412 | | JP | 00-195925 | 7/2000 |
| 2004/0149210 A1 | 8/2004 | Fink | | JP | 2000-323551 | 11/2000 |
| 2005/0095088 A1 | 5/2005 | Kurita et al. | | KR | 199917722 | 6/1999 |
| 2005/0111936 A1* | 5/2005 | Kim et al. ................... 414/217 | | KR | 200035354 | 6/2000 |
| 2005/0150757 A1* | 7/2005 | Black et al. ............... 204/192.1 | | WO | WO 99/13504 | 3/1999 |
| 2006/0021992 A1* | 2/2006 | Narushima et al. ........... 220/817 | | WO | WO 99/18603 | 4/1999 |
| 2006/0103076 A1* | 5/2006 | Hashimoto .................. 277/562 | | WO | WO 99/59928 | 11/1999 |
| 2006/0182534 A1* | 8/2006 | Hiroki ......................... 414/217 | | WO | WO 99/60609 | 11/1999 |
| 2006/0245852 A1* | 11/2006 | Iwabuchi .................... 414/217 | | WO | WO 99/60610 | 11/1999 |
| 2007/0237608 A1* | 10/2007 | Jang et al. ................... 414/217 | | WO | WO 99/60611 | 11/1999 |
| | | | | WO | WO 99/60612 | 11/1999 |
| | | | | WO | WO 99/61350 | 12/1999 |
| | | | | WO | WO 02/23597 A2 | 3/2002 |
| | | | | WO | WO-03073479 | 9/2003 |

FOREIGN PATENT DOCUMENTS

| | | |
|---|---|---|
| EP | 0607797 | 7/1994 |
| EP | 0 608 620 | 8/1994 |
| EP | 0608633 | 8/1994 |
| EP | 0684630 | 11/1995 |
| EP | 0756316 | 1/1997 |
| EP | 0 935 279 | 8/1999 |
| JP | 64-028933 | 1/1989 |
| JP | 02-152251 | 6/1990 |
| JP | 3136345 | 6/1991 |
| JP | 03-274746 | 12/1991 |
| JP | 04-098848 | 3/1992 |
| JP | 04-240721 | 8/1992 |
| JP | 05-013551 | 1/1993 |
| JP | 5-179447 | 7/1993 |
| JP | 05-182891 | 7/1993 |
| JP | 05-283500 | 10/1993 |
| JP | 06-104326 | 4/1994 |
| JP | 06-156624 | 6/1994 |
| JP | 06-163505 | 6/1994 |

OTHER PUBLICATIONS

Chinese First Office Action dated Nov. 17, 2006 for Chinese Application No. 200410098143.7.
Iscoff, R., ed, "Dry Etching Systems: Gearing Up for Larger Wafers", Semiconductor International, Oct. 85, pp. 49-60.
Declaration of Thomas B. Brezocsky, dated Jan. 29, 1999.
Decision of Rejection for Japanese Patent Application No. 2004-306067 dated Jan. 8, 2009.
Office Action, dated Mar. 24, 2009, Korean Application No. 10-2004-0083492.
Prosecution history of U.S. Appl. No. 11/621,039 as of Jun. 11, 2009.
Prosecution history of U.S. Appl. No. 10/832,795 as of Jun. 11, 2009.
Notification of the First Office Action for Chinese Patent Application No. 2007100006065 dated Dec. 4, 2009.

* cited by examiner

DECOUPLED CHAMBER BODY

CROSS-REFERENCE TO RELATED APPLICATION

This application is related to U.S. patent application Ser. No. 10/832,795, entitled "LOAD LOCK CHAMBER FOR LARGE AREA SUBSTRATE PROCESSING SYSTEM", filed Apr. 26, 2004, which is hereby incorporated by reference in its entirety.

BACKGROUND OF THE INVENTION

1. Field of the Invention

Embodiments of the invention generally relate to a chamber body for a vacuum processing system.

2. Description of the Related Art

Thin film transistors (TFT) formed by flat panel technology are commonly used for active matrix displays such as computer and television monitors, cell phone displays, personal digital assistants (PDAs), and an increasing number of other devices. Generally, flat panels comprise two glass plates having a layer of liquid crystal materials sandwiched therebetween. At least one of the glass plates includes one conductive film disposed thereon that is coupled to a power source. Power, supplied to the conductive film from the power source, changes the orientation of the crystal material, creating a pattern display.

With the marketplace's acceptance of flat panel technology, the demand for larger displays, increased production and lower manufacturing costs have driven equipment manufacturers to develop new systems that accommodate larger size glass substrates for flat panel display fabricators. Current glass processing equipment is generally configured to accommodate substrates slightly greater than about five square meters. Processing equipment configured to accommodate larger substrate sizes is envisioned in the immediate future.

Equipment to fabricate such large area substrates represents a substantial investment to flat panel display fabricators. Conventional systems require large and expensive hardware. The large size of the vacuum chambers makes them susceptible to deformation under vacuum conditions. For example, as the top and bottom of the vacuum chamber deflect inward under vacuum conditions, the sealing surface of the vacuum chamber body that interfaces with the slit valve door may become non-planar, making the seal between the slit valve door to vacuum chamber susceptible to leakage. Moreover, large deflections may cause the metal surfaces of the slit valve door and chamber body to rub, thereby creating unwanted particles that may be introduced into the vacuum chamber and contaminate the substrate. As future processing systems are envisioned to process even larger size substrates, the need for improved vacuum chambers capable of rapid transfer of large area substrates is a great concern.

Thus, there is a need for an improved vacuum chamber.

SUMMARY OF THE INVENTION

Embodiments of the invention include a chamber body having at least one of a top or bottom decoupled from the sidewalls of the chamber body. The invention is suitable for use as a load lock chamber, substrate transfer chamber and vacuum processing chambers, among others.

In a first embodiment, a vacuum chamber having at least one of a top and bottom plate decoupled from a tubular body is provided. In one embodiment, the vacuum chamber includes a tubular body having at least two substrate access ports formed therein. A top plate is sealingly disposed on an upper end surface of the body, and a bottom plate is sealingly disposed on a lower end surface of the body. A plurality of fasteners clamp the body between the top and bottom plates.

In another embodiment, a vacuum chamber is provided having top and bottom plates coupled to a tubular chamber body in a manner that permits at least the top plate to move relative to the chamber body. In another embodiment, at least one spacer is disposed between the top plate and the chamber body, thereby maintaining the chamber body and the top plate in a spaced-apart relation.

In yet another embodiment, a vacuum chamber is provided that includes a first plate coupled to a tubular chamber body. The tubular chamber body has at least one substrate access port formed therethrough. A seal is sealingly engaged with the first plate and chamber body. A plurality of vertically stacked spacers are disposed between the first plate and chamber body, and maintain the first plate and chamber body in a spaced-apart relation. A second plate is sealingly coupled to the chamber body, wherein the chamber body and plates bound an interior volume sufficient to accommodate a large area substrate. A substrate support disposed in the interior volume.

BRIEF DESCRIPTION OF THE DRAWINGS

So that the manner in which the above recited features of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the figures. It is contemplated that elements of one embodiment may be advantageously utilized in other embodiments without further recitation.

DETAILED DESCRIPTION

A vacuum chamber having a decoupled body assembly is provided. The components of the body assembly allow forces, such as thermal expansion or deflection due to pressure or other forces, applied to the top of the chamber body assembly to be decoupled from the side walls of a tubular body by allowing lateral movement therebetween. Hence, the term decoupled defines the ability of at least one of the top or bottom plates to move laterally relative to the chamber sidewalls without compromising the vacuum integrity of the chamber. This beneficially maintains the chamber sealing surfaces within operational tolerances and may contribute to reduced particle generation during operation. Although the primary embodiment is described as a load lock chamber, it is contemplated that other vacuum chambers, e.g., such as a substrate transfer, chemical vapor deposition, physical vapor deposition, thermal processing, etch, ion implant or other vacuum chamber may be constructed in the configuration described herein.

Figure 1:
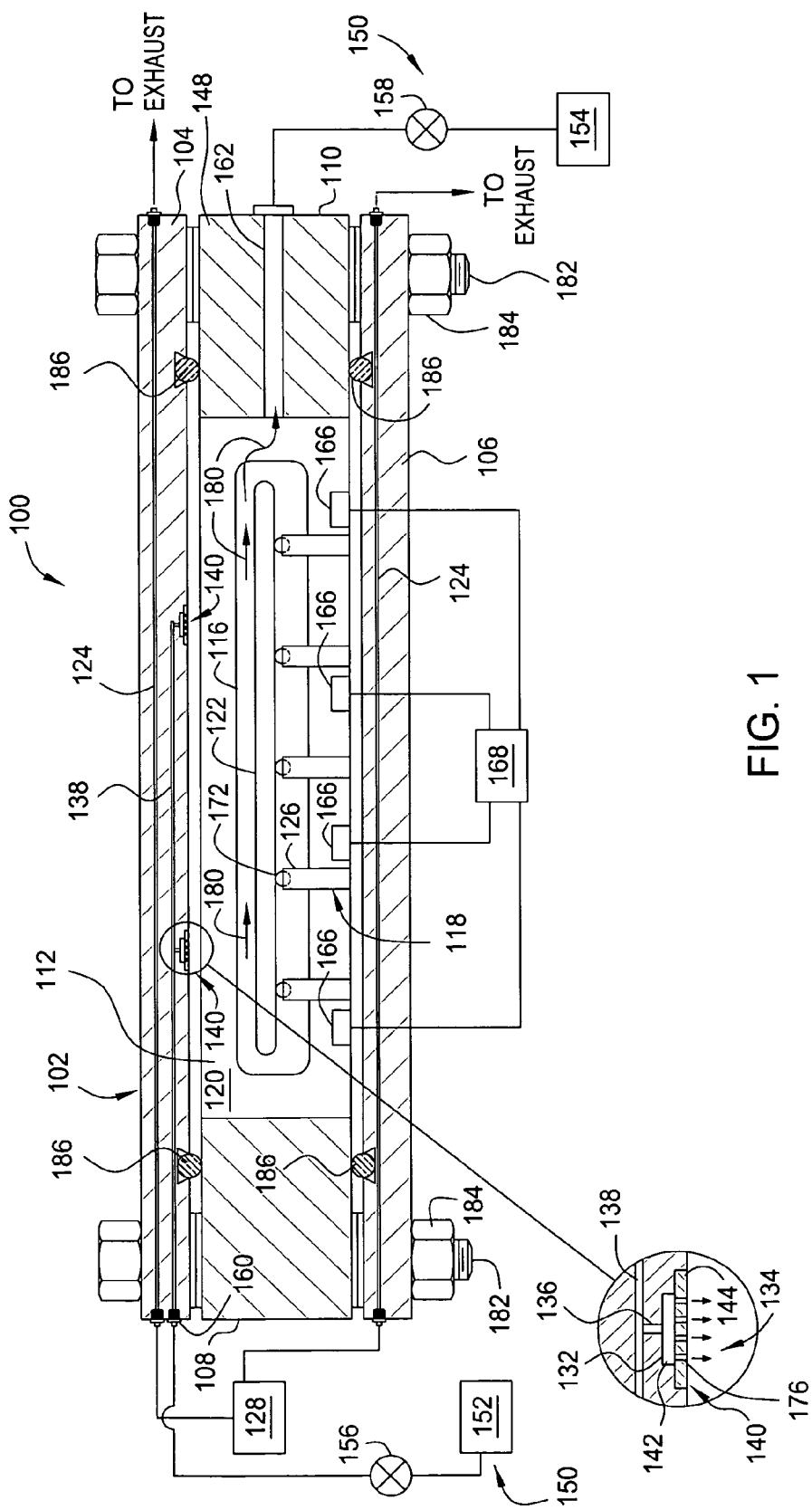
FIG. 1 is a sectional view of one embodiment of load lock chamber.
Figure 2:
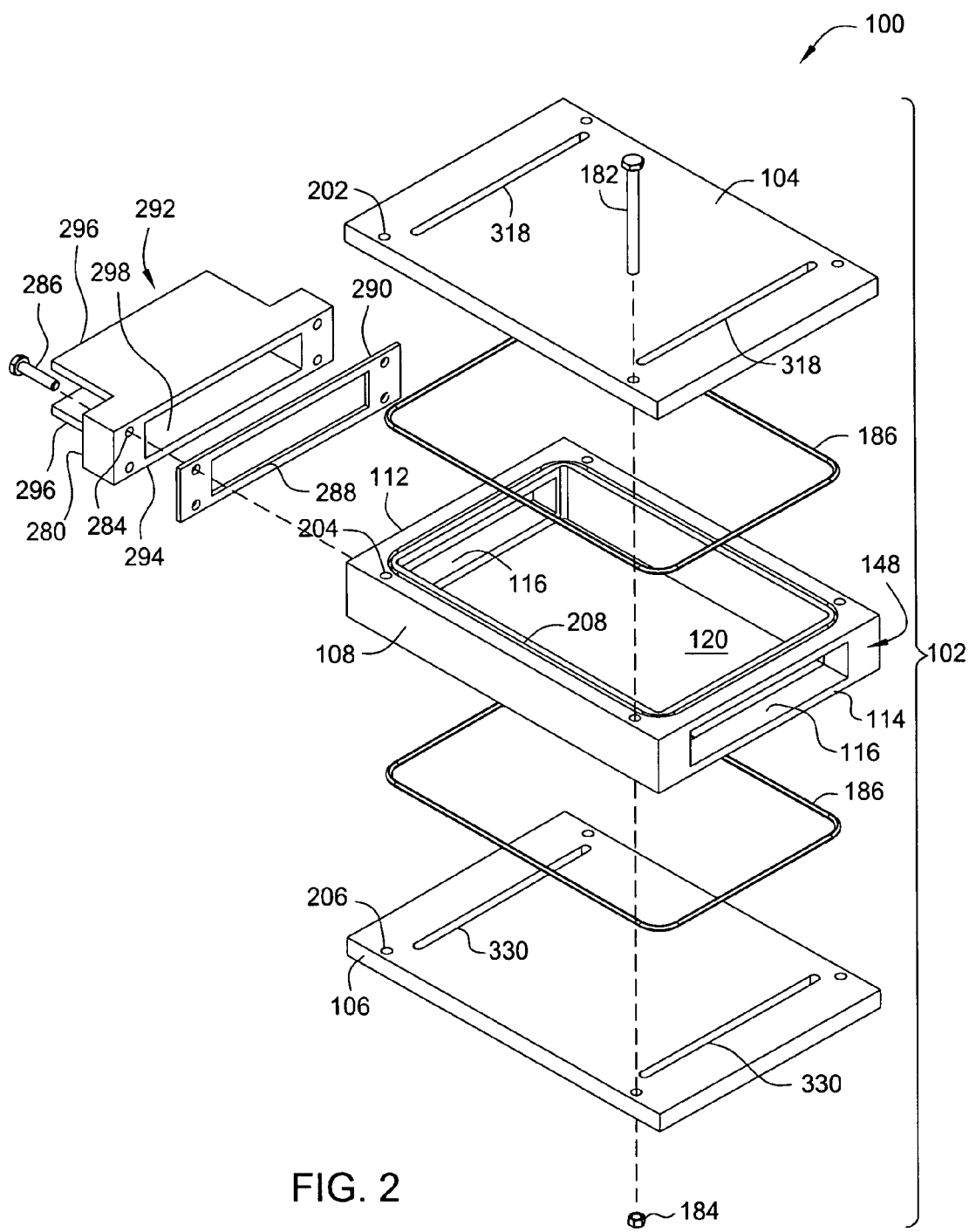
FIG. 2 is an exploded view of the load lock chamber of FIG. 1.

FIG. 1 depicts one embodiment of a load lock chamber 100 of the present invention. The load lock chamber 100 includes a body assembly 102 fabricated from a rigid material such as stainless steel, aluminum or other suitable material. The body assembly 102 is fabricated from an assembly of components into a leak-free structure. In one embodiment, the body assembly 102 includes a top plate 104 and a bottom plate 106 that sandwich a ring-shaped body 148 to enclose an internal volume 120. The body 148 includes sidewalls 108, 110, 112, and 114. The fourth sidewall 114, which is positioned opposite the first sidewall 112, is illustrated in FIG. 2.

At least one substrate access port 116 is disclosed in each of the sidewalls 112 and 114 to allow entry and egress of substrates from an internal volume 120 of the chamber body assembly 102. The substrate access ports 116 are selectively sealed by slit valve doors, which are well known in the art. One slit valve door that may be adapted to benefit from the invention is described in U.S. patent application Ser. No. 10/867,100, entitled CURVED SLIT VALVE DOOR, filed Jun. 14, 2004 by Tanase, et al., and is incorporated by reference in its entirety.

In one embodiment, at least one of the top or bottom plates 104, 106 may be configured as a temperature regulating plate. One or more passages 124 may be formed in the plates 104, 106 and coupled to a fluid source 128. The fluid source 128 provides a heat transfer fluid that is circulated through the passages 142 to regulate (i.e., heat and/or cool) the temperature of the substrate 122.

Optionally, one or more heaters 166 may be disposed in the internal volume 120 of the load lock chamber 100 to selectively heat the substrate 122. In the embodiment depicted in FIG. 1, a plurality of heaters 166 are disposed on the bottom plate 106 and are independently coupled to a power source 168. The position of the heaters 166 below the substrate 112 facilitates efficient radiant heating of the substrate without generating turbulence in gases flowing over the substrate. This configuration allows each heater 166 to be independently controlled, thereby allowing the temperature profile of the substrate 122 to be tailored as desired, for example, to increase heating uniformity or to heat one region of the substrate faster than a second region. In the embodiment depicted in FIG. 1, the heaters 166 are arranged to allow the center of the substrate 122 to be heated at a rate different than the perimeter of the substrate.

A substrate support structure 118 is disposed in the internal volume 120 defined by the body assembly 102. The substrate support structure 118 generally is configured to support one or more substrates 122 being transferred between an ambient and a vacuum environment separated by the load lock chamber 100. Although the substrate support structure 118 depicted in FIG. 1 is illustrated supporting a single substrate 122, it is contemplated that other substrate support structures may also benefit from the invention, including those that support one or more substrates thereon.

The substrate support structure 118 includes a plurality of pins 126. The pins 126 are coupled to the bottom plate 106 of the body assembly 102. The ends of the pins 126 supporting the substrate 112 may be rounded and/or include a ball to reduce dynamic friction between the bottom surface of the substrate 112 and the pins 126 and to prevent substrate scratching. In the embodiment depicted in FIG. 1, a ball 172 is disposed at a distal end of each pin 126. The reduced friction provided by the balls 172 allows the substrate to readily expand and contract while supported on the pins 126 without scratching the substrate. Other suitable substrate supports are described in U.S. Pat. No. 6,528,767, filed Mar. 5, 2003; U.S. patent application Ser. No. 09/982,406, filed Oct. 27, 2001; and U.S. patent application Ser. No. 60/376,857, filed Feb. 27, 2003, all of which are incorporated by reference in their entireties. The pins 126 are generally arranged to facilitate substrate exchange with a robotic end effector.

A pressure control system 150 is coupled to the load lock chamber 100 to control the pressure within the internal volume 120 of the body assembly 102. The pressure control system 150 generally includes a gas source 152 and an exhaust system 154. The gas source 152 is coupled to at least one inlet port 160 formed through the chamber body assembly 102. The gas source 152 provides a vent gas utilized to raise and/or regulate pressure within the internal volume 120 of the chamber body assembly 102. For example, the gas source 152 may flow vent gas into the internal volume 120 to facilitate transfer of the substrate 122 from a vacuum environment to an ambient environment. In one embodiment, the vent gas comprises at least one of nitrogen, helium, air or other suitable gas.

An inlet control valve 156 is disposed between the gas source 152 and the inlet port 160 to selectively control the flow of vent gases into the internal volume 120 of the body assembly 102. The inlet control valve 156 is capable of providing a substantially leak-tight seal under vacuum conditions. In one embodiment, the gas source 152 is configured to control the attributes of the vent gas, such as the flow rate, temperature and/or humidity of the vent gas.

In the embodiment depicted in FIG. 1, the inlet port 160 is coupled to one or more diffusers 140 by a vent passage 138. The diffusers 140 are formed in an interior side of the top plate 102, such that gas flowing into the internal volume 120 is directed toward the top of the substrate 122. This arrangement beneficially assists in cooling the substrate 122 while venting the load lock chamber 100 after processing the substrate 122.

In one embodiment, the diffuser 140 is formed in a recess 132 defined in the interior surface of the top plate 102. A cap 144 covers the recess 132 to define a plenum 142 in the top plate 102. A connecting hole 136 fluidly couples the plenum 142 to the vent passage 138. A plurality of apertures 176 are formed through the cap 144 to allow vent gases to flow from the gas source 152 through plenum 142 and into the interior volume 120, as illustrated by arrows 134. Although the diffusers 140 are primarily intended to direct venting gases into the load lock chamber 100, it is contemplated that the diffusers 140 may also be utilized to evacuate the internal volume 120 of the chamber 100.

The exhaust system 154 is generally coupled to at least one exhaust port 162 formed through the chamber body assembly 102. The exhaust system 154 is configured to remove gases from the internal volume 120 of the load lock chamber 100. The exhaust system 154 may include one or more vacuum pumps (not shown) and may be ultimately coupled to the facilities exhaust system (also not shown). For example, the exhaust system 154 may pump out gas from the internal volume 120 to facilitate transfer of the substrate 122 from an ambient environment to a vacuum environment.

An exhaust control valve 158 is disposed between the exhaust system 154 and the exhaust port 162 to selectively control the flow of gases exiting the internal volume 120 of the body assembly 102. The exhaust control valve 158 is typically similar to the inlet control valve 156 and is capable of providing a substantially leak-tight seal under vacuum conditions.

In the embodiment depicted in FIG. 1, the exhaust port 162 is formed through the sidewalls 110. Thus, when venting the internal volume 120, and/or during cooling of the substrate 122, a flow of vent gases (as represented by flow arrows 180) may optionally be established across the surface of the substrate 122. The flow 180 is generally parallel to the plane of the substrate 122, flowing toward the exhaust port 162. The flow 180 generally increases the heat transfer rate between the substrate 122 and vent gases, advantageously increasing the cooling rate of the substrate. Moreover, by removing the vent gases during venting of the load lock chamber 100, the vent gases heated by the substrate may be removed from the internal volume 120 of the load lock chamber 100 and replaced with cooler vent gases, thereby increasing the cooling rate of the substrate by substantially maintaining the temperature differential between the vent gas and substrate.

Referring additionally to an exploded view of the load lock chamber 100 in FIG. 2, the top and bottom plates 104, 106 are sealingly coupled to the body 148 by a plurality of fasteners in a manner that permits relative movement between at least one of the top and bottom plates 104, 106 and the body 148. For example, at least one of the top and bottom plates 104, 106 are coupled to the body 148 without welding. In embodiments wherein force applied to the sidewalls from the plates 104, 106 is not of great concern, the top and bottom plates 104, 106 and the body 148 may be coupled by welding.

In the embodiment depicted in FIGS. 1-2, a plurality of fasteners, shown as a bolt 182 and nut 184, clamp the body 148 between the top and bottom plates 104, 106. The number of bolts 182 shown in the figures has been minimized for clarity. However, it is contemplated that a sufficient number of fasteners will be utilized to adequately seal the chamber 100 under operating conditions. Holes 202, 204, 206 are provided respectively through the top plate 104, body 148 and bottom plate 106 to accommodate the fasteners.

A groove 208 is formed inward of the holes 202, 204, 206, such that seal 186, such as a gasket or o-ring, may be positioned inward of the fasteners to effectively seal the internal volume 120 of the load lock chamber 100. The groove 208 for the gasket 186 may be provided in either the top plate 104 or body 148.

Figure 3:
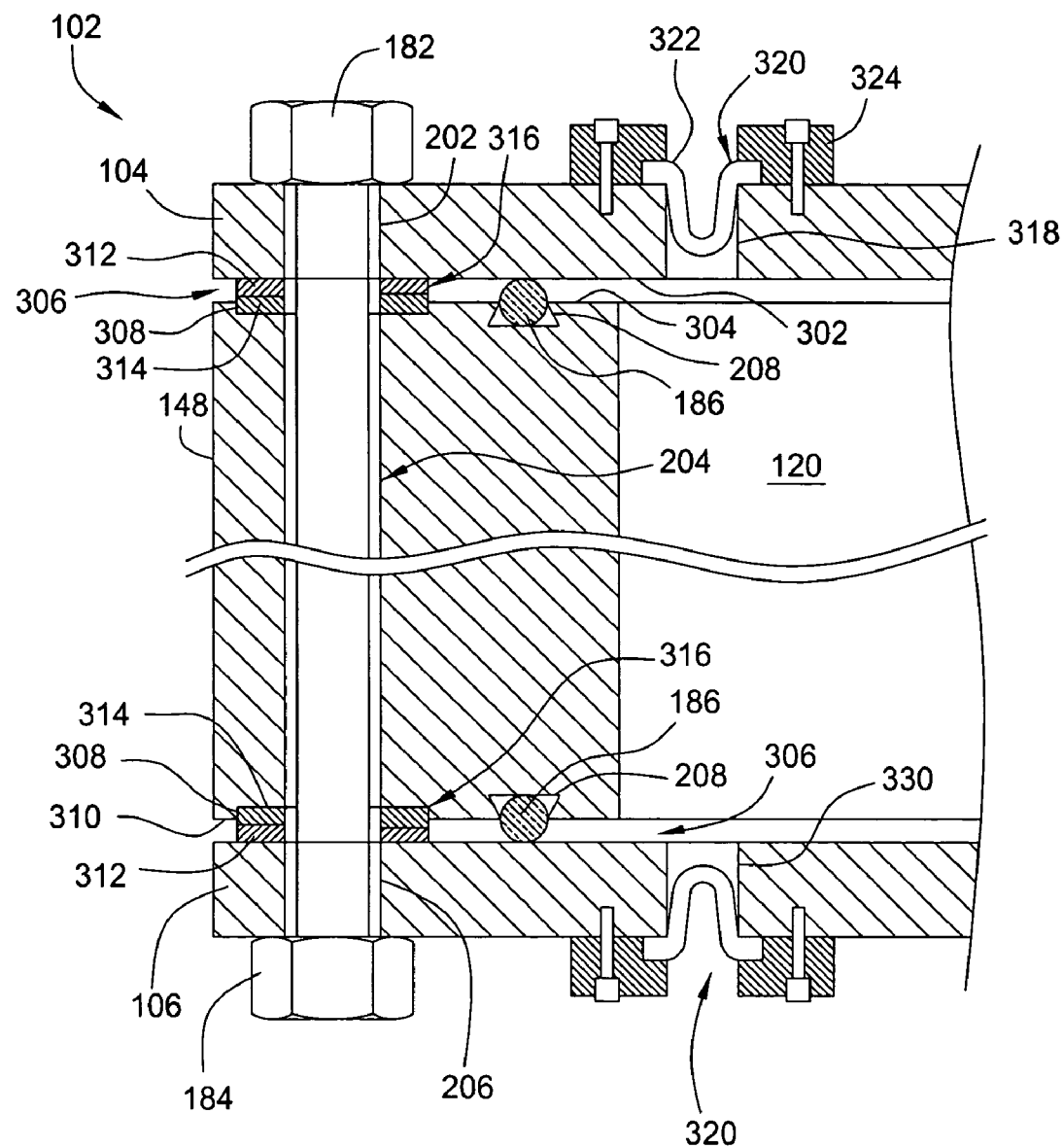
FIG. 3 is a partial sectional view of the load lock chamber of FIG. 1.

Referring additionally to a partial sectional view of the body assembly 102 depicted in FIG. 3, at least one spacer 316 is provided between a lower surface 302 of the top plate 104 and an upper surface 304 of the body 148. The spacer 316 separates the top plate 104 and chamber body 148, such that a gap 306 is defined therebetween. In one embodiment, the spacer 316 is a member having a plan area much smaller than the plan area of the upper surface 304 of the chamber body 148. For example, a plurality of spacers 316 may be disposed on upper surface 304 along one side of the chamber body 148.

The thickness of the spacer 316 is selected such that the gasket 186 is adequately compressed to maintain a vacuum seal while preventing the top plate 104 from contacting the chamber body 148 under vacuum or other stress conditions. Similarly, one or more spacers 316 are provided between the bottom plate 106 and the chamber body 148 to maintain a gap 306 therebetween.

In the embodiment depicted in FIG. 3, a first spacer 312 and a second spacer 314 are shown disposed between the top plate 104 and the chamber body 148. The spacers 312, 314 are fabricated from a material having a lower coefficient of friction between itself (i.e., spacer 312 to spacer 314) than a coefficient of friction between the spacer and the chamber body 148 and/or top plate 104. Thus, as the chamber body 148 and the top plate 104 move relative to each other due to vacuum, thermal or other forces, the top plate 104 and first spacer 312 are free to translate laterally across the second spacer 314 (and body 148) while preventing the top plate 104 and body 148 from touching.

In one embodiment, the spacers 312, 314 are disks. The disks may be washers disposed around the bolts 182 for ease of assembly. As the sliding components (e.g., the spacers 312, 314) have reduced contact area relative to the upper surface 304 of the body 148, the force necessary to begin motion is reduced. Additionally, as the contacting surface of the spacers 312, 314 are outward of the gasket 186, any particles generated during the sliding of the spacers 312, 314 are beneficially prevented from entering the internal volume 120 of the load lock chamber 100. It is contemplated that the spacers 316 may be in the form of a rib or other feature, extending between the plates and body to maintain a gap therebetween. It is also contemplated that the spacer may be incorporated into either the plates or body. It is contemplated that the spacers 316 may be in the form of a rib or other feature extending between the plates and body to maintain a gap therebetween. It is also contemplated that the spacer may be incorporated into either the plate or body (i.e., have unitary construction).

In the embodiment depicted in FIG. 3, a recess 308 is formed in the upper surface 304 of the body 148 to locate the second spacer 314. Optionally, a recess (not shown) may be formed in the top plate 104 to locate the first spacer 312. The recess (not shown) 308 has a depth selected, such that the spacer 314 extends beyond the upper surface 304 to ensure the first spacer 312 is free to slide laterally relative to the body 148.

To further minimize the effect of forces exerted on the top plate 104 of the load lock chamber 100, at least one slot 318 is formed therein. The slots 312 allow the central region of the top plate 104 to move, deflect and/or expand while minimizing the effect of motion on the edges of the top plate. A seal assembly 320 disposed in the slot 318 to prevent leakage into interior volume 120 of the load lock chamber 100. In the embodiment depicted in FIG. 3, the seal assembly 320 includes gasket or bellows 322 clamped to the top plate 104 by a clamp block 324. Similarly, the bottom plate 206 includes at least one slot 330 sealed by a seal assembly 320, as described above.

Referring back to FIG. 2, the sidewall of the tubular body 148 facing the factory interface may additionally include a stiffening member 292. The stiffening member attached to the exterior of the sidewall 112 provides a door sealing surface 280 decoupled from the deflection of the body 148. In one embodiment, the stiffening member 292 includes a plate 294 having one or more ribs 296 extending from or coupled to the sealing surface 280 away from the body assembly 148. Typically, the ribs 296 are oriented substantially perpendicular to the plane of the wall 112. The plate 294 includes a plurality of holes 284 to facilitate fastening the stiffening member 292 to the body assembly 148. In the embodiment depicted in FIG. 2, a fastener 286 passes through the hole 284 and is threaded into a blind hole (not shown) formed in the body assembly 148. A gasket 290 is disposed between the stiffening member 292 and the wall 112. The gasket 290 decouples the motion and/or deflection of the body assembly 148 from the sealing surface 280, thereby enhancing the slit valve door seal and extending the door seal (o-ring) life, while preventing particle generation from o-ring twisting/pinching and preventing metal to metal contact between the door and sealing surface 280. The gasket 290 is generally fabricated from a suitable polymer or elastomeric material. Substrate transfer passages 298, 288 are formed in the plate 294 and gasket 290 and align with the substrate access port 216 formed in the sidewall 212 to facilitate entry and egress of the substrate from the load lock chamber 100.

Figure 4:
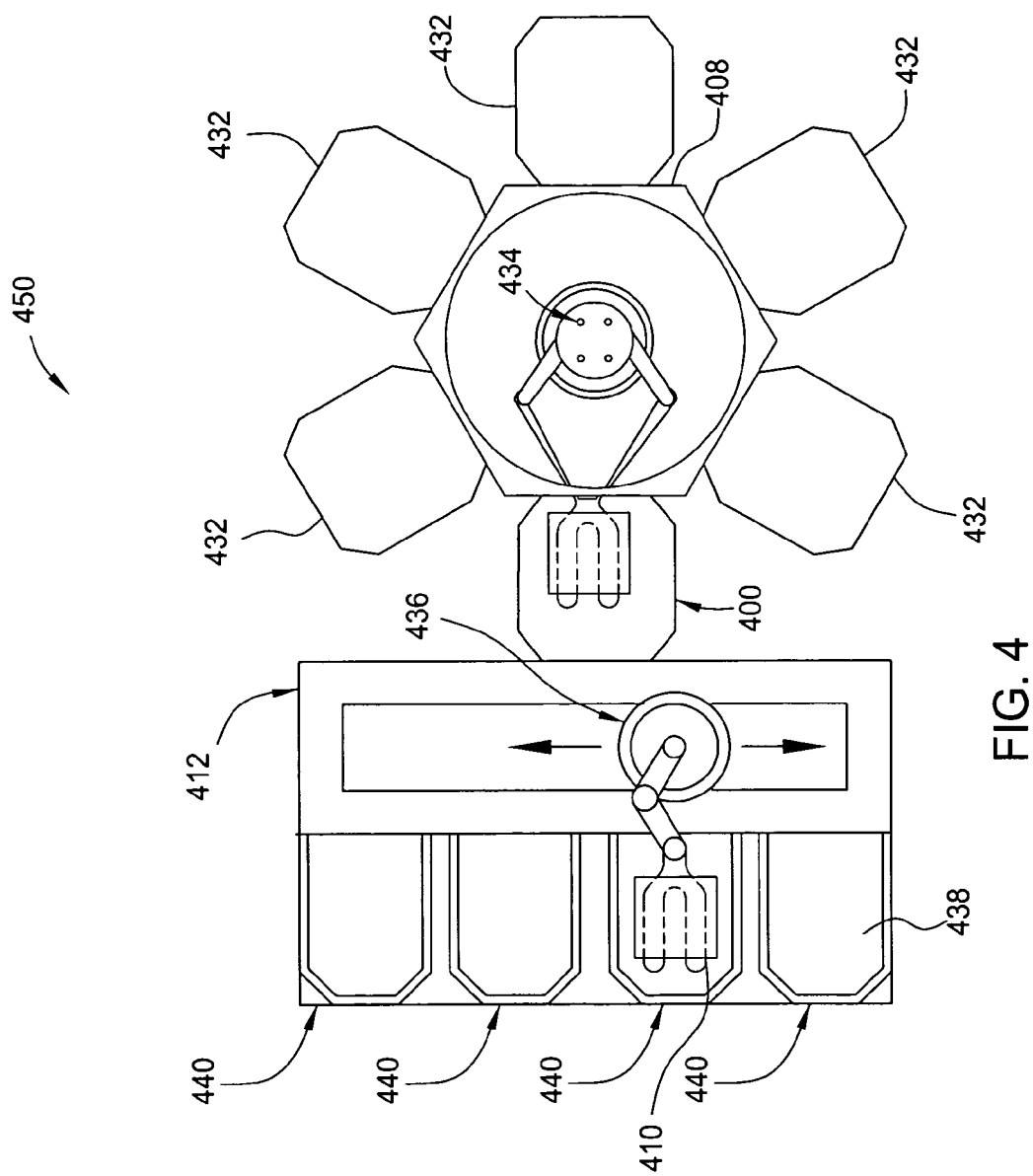
FIG. 4 is a plan view of one embodiment of a cluster tool.

FIG. 4 is a top plan view of one embodiment of a cluster tool or process system 450 suitable for processing large area substrates (e.g., substrates having a plan area greater than about 2.7 square meter). At least one chamber of the system 450 includes a top plate decoupled from a chamber body.

The process system 450 illustrated in FIG. 4 includes a transfer chamber 408 coupled to a factory interface 412 by a load lock chamber 400 having a plurality of single substrate transfer chambers. The transfer chamber 408 has at least one dual blade vacuum robot 434 disposed therein that is adapted to transfer substrates between a plurality of circumscribing vacuum process chambers 432 and the load lock chamber 400. Typically, the transfer chamber 408 is maintained at a vacuum condition to eliminate the necessity of adjusting the pressures between the transfer chamber 408 and the individual process chambers 432 after each substrate transfer.

The process chambers 432 may be any chamber suitable for processing substrates. For example, at least one of the process chamber 432 may be a physical vapor deposition chamber, a chemical vapor deposition chamber, an etch chamber, ion implant chamber, a thermal treatment chamber or other chamber maintained under vacuum.

The factory interface 412 generally includes a plurality of substrate storage cassettes 438 and a dual blade atmospheric robot 436. The cassettes 438 are generally removably disposed in a plurality of bays 440 formed on one side of the factory interface 412. The atmospheric robot 436 is adapted to transfer substrates 410 between the cassettes 438 and the load lock chamber 400. Typically, the factory interface 412 is maintained at or slightly above atmospheric pressure.

Figure 5:
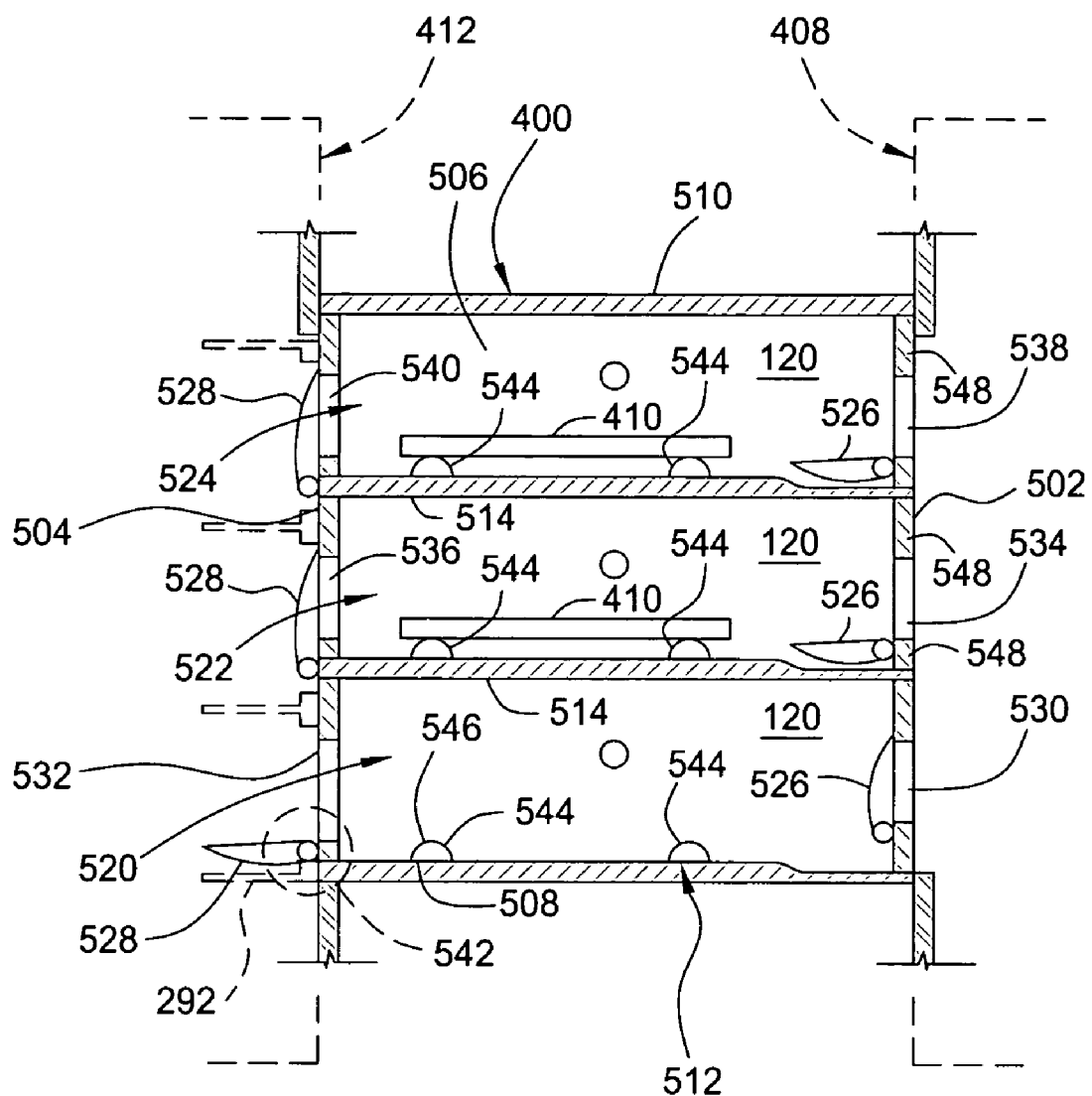
FIG. 5 is a side sectional view of one embodiment of a multiple chamber load lock chamber.

FIG. 5 is a sectional view of one embodiment of the multi-chamber load lock 400 of FIG. 4. The load lock chamber 400 has a decoupled chamber body assembly 512 that includes a plurality of vertically-stacked tubular chamber bodies 548 that are separated by vacuum-tight, horizontal interior walls 514. Although three vertically-stacked tubular chamber bodies 548 are shown in the embodiment depicted in FIG. 5, it is contemplated that the chamber body assembly 512 of the load lock chamber 400 may include two or more vertically-stacked chamber bodies 548, each chamber body circumscribing a respective substrate transfer chamber defined within the load lock chamber 400. For example, the load lock chamber 400 may include N substrate transfer chambers defined in a chamber body 548 separated by N−1 horizontal interior walls 514, where N is an integer greater than one.

In the embodiment depicted in FIG. 5, substrate transfer chambers 520, 522, 524 are each defined within a respective chamber body 548 and configured to accommodate a single large area substrate 410 so that the volume of each chamber may be minimized to enhance fast pumping and vent cycles. In the embodiment depicted in FIG. 5, each substrate transfer chamber 520, 522, 524 has an internal volume of equal to or less than about 4000 liters, such as less than about 1400 liters, and can accommodate substrates having a plan surface area of about 5 square meters. It is contemplated that a substrate transfer chamber of the present invention may be configured to accommodate different size substrates having a greater or less plan area.

The chamber body 548 includes first sidewall 502, a second sidewall 504, a third sidewall 506 and a fourth sidewall (not shown in FIG. 5). A bottom plate 508 is coupled to the lower-most chamber body 548 opposite the interior wall 514 to define the lower-most transfer chamber 520. The middle transfer chamber 522 is defined between the two interior walls 514. A top plate 510 is coupled to the upper-most chamber body 548 opposite the interior wall 514 to define the upper-most transfer chamber 524.

Figure 6:
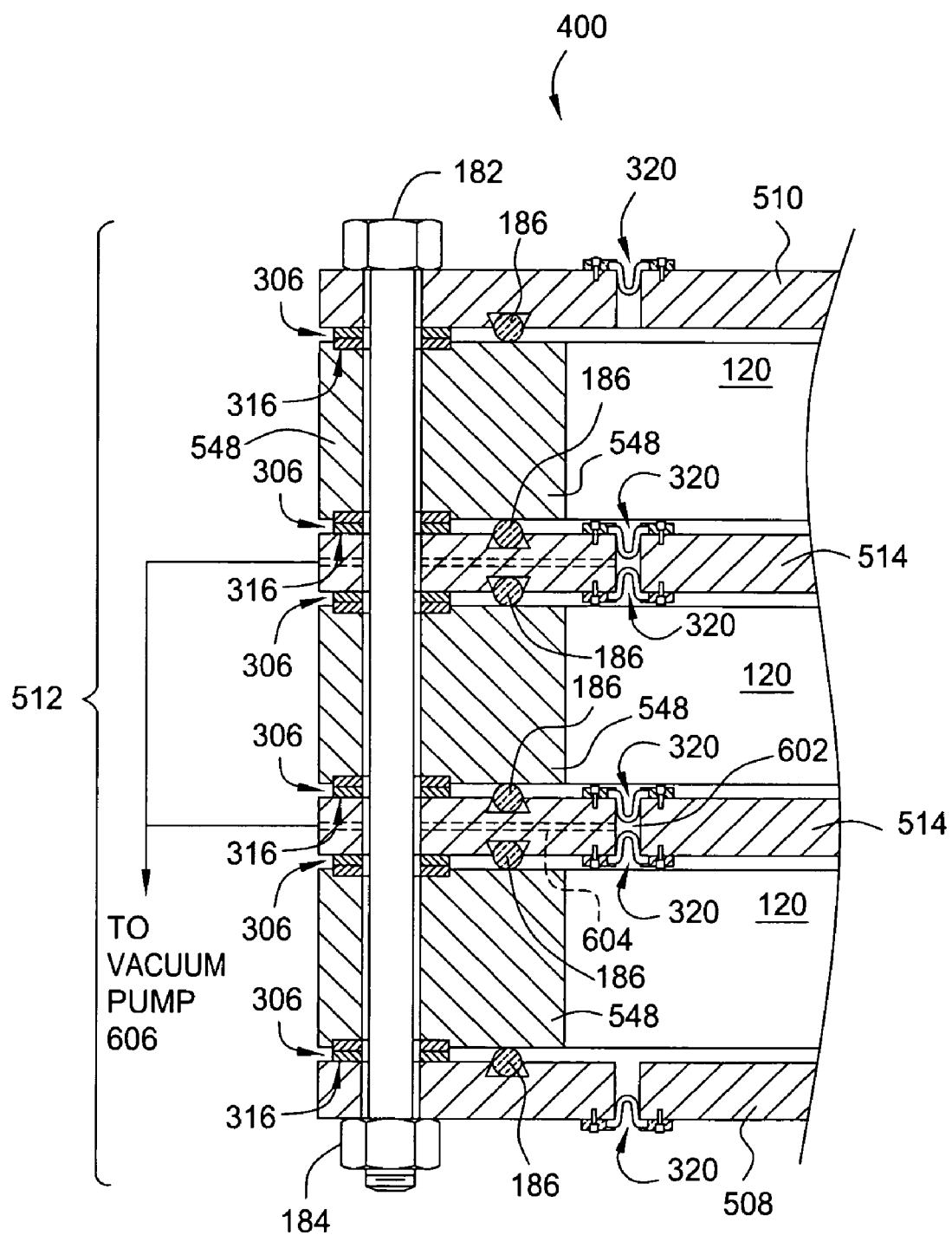
FIG. 6 is a partial sectional view of the load lock chamber of FIG. 5.

FIG. 6 is a partial sectional view of the load lock chamber 400 illustrating the decoupled assembly of the chamber bodies 548, interior plates 514, the top plate 510 and the bottom plate 508. The chamber bodies 548 are sealingly coupled to at least one of the plates 508, 510, 514 in a manner that permits lateral movement of the body 548 relative to at least one of the plates 508, 510, 514. A plurality of fasteners, such as a bolt 182 and nut 184, may be utilized to clamp the chamber body assembly 512 together. In the embodiment depicted in FIG. 6, the bolt 182 is of sufficient length to fasten the entire stack defining the chamber body assembly 512. A discussed above, a seal 186 is disposed inward of the fasteners to maintain the vacuum integrity of the load lock chamber 400.

In one embodiment, the chamber bodies 548 are maintained in a spaced-apart relation to the plates 508, 510, 514 by at least one spacer 316. The spacer 316, as described above, allows movement of the plates 508, 510, 514 relative to the body 548 without compromising the vacuum seal. In the depicted in FIG. 6, a plurality of spacers 316 are vertically stacked in each gap 306 respectively defined between the plates 508, 510, 514 and body 548.

Returning to FIGS. 4-5, each of the substrate transfer chambers 520, 522, 524 defined in the chamber body assembly 512 includes two substrate access ports. The ports are configured to facilitate the entry and egress of large area substrates 410 from the load lock chamber 400. In the embodiment depicted in FIG. 5, the first substrate transfer chamber 520 bounded by the bottom plate 508 includes a first substrate access port 530 and a second substrate access port 532. The first substrate access port 530 couples the first substrate transfer chamber 520 to the central transfer chamber 408 of the processing system 450. The second substrate access port 532 is formed through the second wall 504 of the chamber body assembly 512 and couples the first substrate transfer chamber 520 to the factory interface 412. In the embodiment depicted in FIG. 5, the substrate access ports 530, 532 are disposed on opposite sides of the chamber body assembly 512, however, the ports 530, 532 may alternatively be positioned on adjacent walls of the body assembly 512. The ports facing the factory interface may be stiffened by a stiffening member, such as the stiffening member 292, described with reference to FIG. 2. The stiffening member provides rigidity that minimizes defection of the sealing surfaces which would cause particle generation through door rubbing or during wear.

Each of the substrate access ports 530, 532 is selectively sealed by a respective slit valve door 526, 528 adapted to selectively isolate the first substrate transfer chamber 520 from the environments of the transfer chamber 408 and the factory interface 412. The slit valve doors 526, 528 are moved between an open and closed position by an actuator 542 (one actuator 542 shown in phantom in FIG. 5 is normally positioned outside the chamber body assembly 512). In the embodiment depicted in FIG. 5, each of the slit valve doors 526, 528 is pivotally coupled to the chamber body assembly 512 along a first edge and rotated between the open and closed position by the actuator 542.

The first slit valve door 526 seals the first substrate access port 530 from the interior side of the first substrate transfer chamber 520 such that a vacuum (e.g., pressure) differential between the first substrate transfer chamber 520 and the vacuum environment of the central transfer chamber 408 assists in loading and sealing the slit valve door 526, thereby enhancing the vacuum seal. Correspondingly, the second slit valve door 528 is disposed on the exterior of the load lock chamber 100 and is thereby positioned such that the pressure differential between the ambient environment of the factory interface 412 and the vacuum environment of the first substrate transfer chamber 520 assists in sealing the second substrate access port 532. Other examples of slit valve doors that may be adapted to benefit from the invention are described in U.S. Pat. No. 5,579,718, issued Dec. 10, 1996 to Freerks and U.S. Pat. No. 6,045,620, issued Apr. 11, 2000 to Tepman, et al., both of which are hereby incorporated by reference in their entireties.

The second substrate transfer chamber 522 is similarly configured with access ports 534, 536 and slit valve doors 526, 528. The third substrate transfer chamber 524 is similarly configured with access ports 538, 540 and slit valve doors 526, 528.

The substrate 410 is supported above the bottom plate 508 of the first substrate transfer chamber 520 and the interior walls 514 bounding the bottom of the second and third substrate transfer chambers 522, 524 by a plurality of substrate supports 544. The substrate supports 544 are configured and spaced to support the substrate 410 at an elevation above the bottom plate 508 (or walls 514) to avoid contact of the substrate with the chamber body assembly 512. The substrate supports 544 are configured to minimize scratching and contamination of the substrate. In the embodiment depicted in FIG. 5, the substrate supports 544 are stainless pins having a roller ball defining a rounded upper end 546. Other suitable substrate supports are described in U.S. Pat. No. 6,528,767, filed Mar. 11, 2003; U.S. patent application Ser. No. 09/982,406, filed Oct. 17, 2001; and U.S. patent application Ser. No. 10/376,857, filed Feb. 27, 2003, all of which are incorporated by reference in their entireties.

Optionally, to further accommodate deflection of the plates 508, 510, 514 without distortion of the tubular body 548, the plates 508, 510, 514 may include one or more slots 660 sealed by a sealing assembly 320. In the embodiment depicted in FIG. 6, the upper and lower sides of the interior walls 514 have a sealing assembly to provide an additional measure of isolation between the interior volumes 120. An interstitial plate volume 602 defined between the sealing assemblies 320 coupled to each wall 514 is coupled by a passage 604 (shown in phantom) formed through the wall 514 to a vacuum pump 606. Providing a vacuum in the interstitial volume 602 extends the life of the seal assembly 320, and additionally, minimizes movement of the seal assembly 320 due to changes in pressure in the internal volumes 120 of the respective chambers, thereby minimizing the potential of particle generation.

Figure 7:
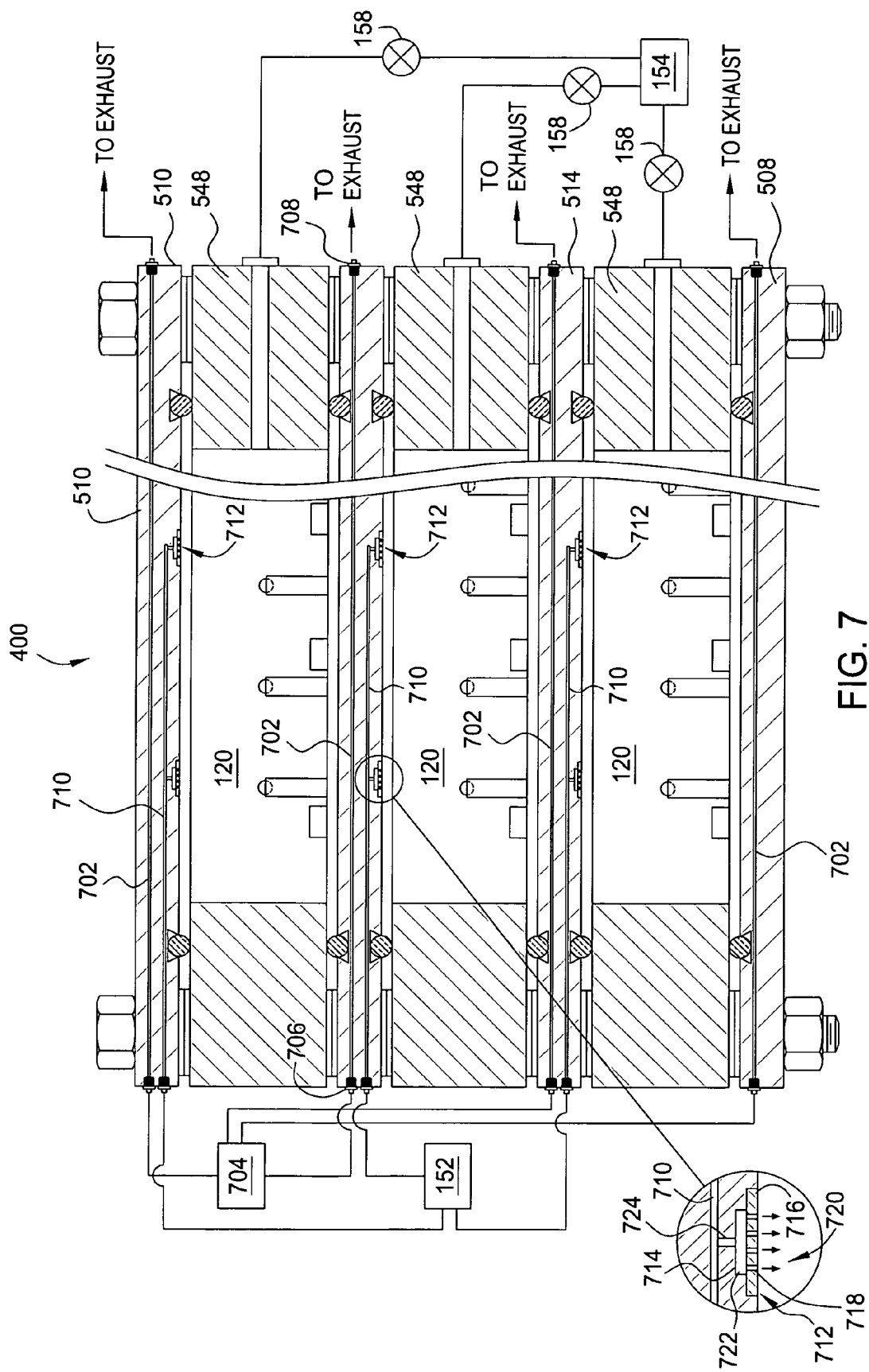
FIG. 7 is another sectional view of the load lock chamber of FIG. 5.

FIG. 7 is another sectional view of the load lock chamber 400. In the embodiment depicted in FIG. 7, the internal horizontal walls 514 include at least one coolant passage 702 configured to flow a temperature control fluid provided by a fluid source 704. In the embodiment depicted in FIG. 7, the inlet 706 and the outlet 708 are respectively disposed on opposite sides of the internal plate 514 to route the cooling fluid through the wall 514. It is contemplated that the cooling passage 702 may be configured with alternative routings through the wall 514.

Also depicted in the embodiment of FIG. 7, vent gas provided from the source 152 is routed through one or more vent passages 710 formed in the internal wall 514. The vent passage 710 is in fluid communication with the interior volume 120 of the load lock chamber 400 through a plurality of diffusers 712 formed in the bottom of the internal wall 514. It is contemplated that the top plate 510 may be similarly configured to provide vent gas to the upper most internal volume 120.

The diffuser 712 is generally defined in a recess 714 formed in the bottom of the internal wall 514. A cap 716 is coupled to the internal wall 514 to define a plenum 722 in the bottom portion of the recess 714. The cap 716 includes a plurality of holes 718 formed therethrough which allows gases to communicate between the plenum 722 and the interior of the chamber 120, as shown by arrows 720. A hole 724 couples the bottom of the recess 714 to the vent passage 710. It is contemplated that the vent passage 710 may also be utilized to evacuate the chamber volume 120 or that the chamber volume 120 may be evacuated as described with reference to FIG. 1 or by other suitable methods.

Figure 8:
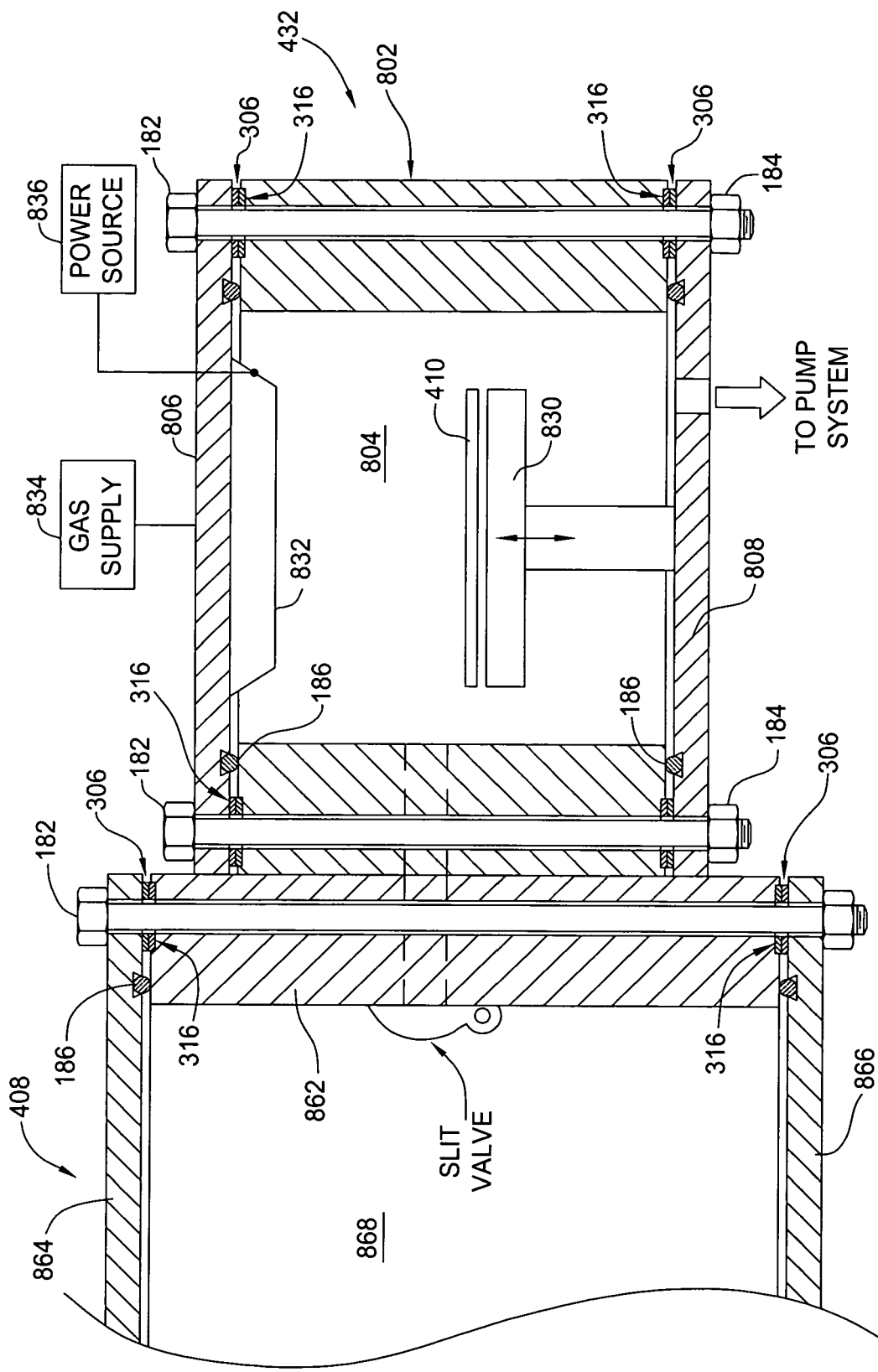
FIG. 8 is a sectional view of a portion of a transfer and process chamber of the cluster tool of FIG. 4.

FIG. 8 is a partial sectional view of one embodiment of the transfer chamber 408 and one of the processing chambers 432 of the cluster tool 450. In one embodiment, the processing chamber 432 includes a tubular body 802 circumscribing a processing volume 804. The processing volume 804 is bounded on a top and bottom by plates 806, 808 sealing coupled to the tubular body 802 in a manner that permits lateral movement of the body 802 relative to at least one of the plates 806, 808. A plurality of fasteners, such as a bolt 182 and nut 184, may be utilized to clamp the body 802 between the plates 806, 808.

In one embodiment, the process chamber body 802 is maintained in a spaced-apart relation to the plates 806, 808 by at least one spacer 316. The spacer 316, as described above, allows movement of the plates 806, 808 relative to the body 802 without compromising the vacuum seal. In the embodiment depicted in FIG. 8, a plurality of spacers 316 are vertically stacked in each gap 306 defined between the plates 806, 808 and body 802.

As discussed in the embodiment above, a seal 186 is disposed inward of the fasteners to maintain the vacuum integrity of the process chamber 432. Optionally, to further accommodate deflection of the plates 806, 808 without distortion of the tubular body 802, the plates 806, 808 may include one or more slots sealed by a sealing assembly similar to the slots 318, 330 and sealing assembly 320, as shown in the embodiment of FIGS. 2-3.

In the embodiment depicted in FIG. 8, the process chamber 432 includes a vertically movable heated substrate support 830 disposed below a showerhead 832. A gas supply 834 is coupled to the process chamber 432, such that gas entering the processing volume 804 is distributed in a predefined manner by the showerhead 832 across the width of the substrate 410 disposed on the support 830. Optionally, a power source 836 may be coupled to the showerhead 832 to energize the gas within the processing volume 804, such as in a plasma enhanced, chemical vapor deposition process. Although the process chamber 432 is illustrated as a plasma enhanced, chemical vapor deposition chamber, it is contemplated that other vacuum chambers suitable for substrate transfer, physical vapor deposition, etching, ion implanting and thermal processing, among others, may be adapted to benefit from the decoupled body assembly construction described herein.

For example, as illustrated by the transfer chamber 408 depicted in FIG. 8, the transfer chamber 408 may also include a tubular body 862 sealing coupled to top and bottom plates 864, 866 in a manner that permits lateral movement of the body 862 relative to at least one of the plates 864, 866. The body 862 and the plates 864, 866 bound a transfer volume 868 having the robot 434 disposed therein (as depicted in FIG. 4).

In one embodiment, the chamber body 862 is maintained in a sealed yet spaced-apart relation to the plates 864, 866 by at least one spacer 316. The spacer 316, as described above, allows movement of the plates 864, 866 relative to the body 862 without compromising the vacuum seal. In the depicted in FIG. 8, a plurality of spacers 316 are vertically stacked in each gap 306 defined between the plates 864, 866 and body 862.

A plurality of fasteners, such as a bolt 182 and nut 184, may be utilized to clamp the body 862 between the plates 864, 866. A discussed above, a seal 186 is disposed inward of the fasteners to maintain the vacuum integrity of the transfer chamber 408. Optionally, to further accommodate deflection of the plates 864, 866 without distortion of the tubular body 862, the plates 864, 866 may include one or more slots sealed by a sealing assembly similar to the slots 318, 330 and sealing assembly 320, as shown in the embodiment of FIGS. 2-3.

Thus, a vacuum chamber having a decoupled body assembly construction is provided. The construction allow components of the body assembly to move laterally relative to one another to prevent distortion of the sealing surfaces and/or metal to metal rubbing in areas exposed to the interior of the chamber.

While the foregoing is directed to the preferred embodiment of the present invention, other and further embodiments of the invention may be devised without departing from the basic scope thereof. The scope of the invention is determined by the claims which follow.

What is claimed is:

1. A load lock chamber comprising:
   a tubular first body having at least two substrate access ports formed therein;
   a first plate sealingly disposed on an upper end surface of the first body;
   a bottom plate sealingly disposed on a lower end surface of the first body, wherein the plates and body enclose a substrate transfer chamber; and
   a plurality of fasteners clamping the first body between the first and bottom plates, wherein at least one of the first and bottom plates is coupled to the body in a manner that permits lateral movement of at least one of the plates relative to the body.

2. The load lock chamber of claim 1 further comprising:
   a plurality of spacers disposed between the first plate and the upper end surface of the first body.

3. The load lock chamber of claim 2, wherein the spacers maintain the first plate and the upper end surface of the first body in a spaced-apart relation.

4. The load lock chamber of claim 2, wherein the plurality of spacers further comprises:
   at least two spacers vertically stacked between the first body and the first plate.

5. The load lock chamber of claim 4, wherein the spacers have lower sliding resistance between each other than a sliding resistance between the spacer and at least one of the first body or first plate.

6. The load lock chamber of claim 4, wherein the spacers are fabricated from stainless steel, and the first plate and first body are fabricated from aluminum.

7. The load lock chamber of claim 4, wherein one of the plurality of fasteners passes through a passage formed through the stacked spacers.

8. The load lock chamber of claim 4 further comprising:
   a first seal sealing the first plate to the first body, the first seal positioned inward of the plurality of spacers.

9. The load lock chamber of claim 1, wherein the first plate further comprises:
   at least one slot formed therethrough inward of the first body; and
   a seal coupled to the first plate and preventing fluid passage through the slot.

10. A load lock chamber comprising:
    a tubular first body having at least two substrate access ports formed therein;
    a first plate sealingly disposed on an upper end surface of the first body;
    a bottom plate sealingly disposed on a lower end surface of the first body, wherein the plates and body enclose a substrate transfer chamber;
    a plurality of fasteners clamping the first body between the first and bottom plates;
    a second tubular body having a lower end sealingly disposed on the first plate, the second body having two substrate access ports formed therein; and
    a second plate sealingly disposed on an upper end of the second body, the first plate, second plate and second body defining a second substrate transfer chamber.

11. The load lock chamber of claim 10, wherein the plurality of fasteners clamps the first plate between the first and second bodies.

12. The load lock chamber of claim 10 further comprising:
    a second plurality of spacers disposed between the lower end of the second body and the first plate and maintaining the first plate and second body in a spaced-apart relation.

13. A load lock chamber comprising:
    a tubular first body having at least two substrate access ports formed therein;
    a first plate sealingly disposed on an upper end surface of the first body;
    a bottom plate sealingly disposed on a lower end surface of the first body, wherein the plates and body enclose a substrate transfer chamber; and
    a plurality of fasteners clamping the first body between the first and bottom plates; wherein the plates are not welded to the first body and at least one of the first and bottom plates is coupled to the body in a manner that permits lateral movement of at least one of the plates relative to the body.

14. The load lock chamber of claim 1, wherein the plurality of fasteners further comprises bolts.

15. The load lock chamber of claim 1 further comprising:
    at least one stiffening member coupled to an exterior of the first body adjacent to one of the substrate access ports formed therein.

16. A load lock chamber comprising:
    a first chamber body having four walls, an open top and an open bottom;
    a bottom plate disposed below the first chamber body, the bottom plate and the first chamber body disposed in a spaced apart relation;
    a first seal circumscribing the open bottom and sealingly engaged with the bottom plate and the first chamber body;
    a first plate disposed above the first chamber body, the first plate and the first chamber body disposed in a sealed spaced apart relation;
    a second chamber body disposed above the first plate;
    a second seal sealingly engaged with the first plate and the second chamber body;
    a second plate disposed above the second chamber body, the second plate and the second chamber body disposed in a spaced apart relation; and
    a third seal sealingly engaged with the second plate and the second chamber body.

17. The load lock chamber of claim 16 further comprising:
a plurality of bolts clamping the chamber bodies between the bottom plate and the second plate.

18. The load lock chamber of claim 16 further comprising:
at least one spacer disposed between the first plate and the first chamber body.

19. The load lock chamber of claim 16 further comprising:
at least two vertically stacked spacers separating the first plate from the first chamber body.

20. The load lock chamber of claim 10, wherein at least one of the first and bottom plates is coupled to the body in a manner that permits lateral movement of at least one of the plates relative to the body.

21. The load lock chamber of claim 16, wherein at least one of the first and bottom plates is coupled to the body in a manner that permits lateral movement of at least one of the plates relative to the body.

* * * * *